(12) United States Patent
Ohkubo

(10) Patent No.: US 6,678,869 B2
(45) Date of Patent: Jan. 13, 2004

(54) DELAY CALCULATION METHOD AND DESIGN METHOD OF A SEMICONDUCTOR INTEGRATED CIRCUIT

(75) Inventor: Norio Ohkubo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/925,382

(22) Filed: Aug. 10, 2001

(65) Prior Publication Data

US 2002/0095646 A1 Jul. 18, 2002

(30) Foreign Application Priority Data

Nov. 28, 2000 (JP) ........................................ 2000-360657

(51) Int. Cl.[7] .............................................. G06F 17/50
(52) U.S. Cl. ................................... 716/6; 716/5; 716/2
(58) Field of Search .................................. 716/6, 1–18

(56) References Cited

U.S. PATENT DOCUMENTS

| | | | | |
|---|---|---|---|---|
| 5,751,593 A | * | 5/1998 | Pullela et al. .................. | 716/6 |
| 6,026,228 A | * | 2/2000 | Imai et al. ..................... | 716/18 |
| 6,209,121 B1 | * | 3/2001 | Goto .............................. | 716/6 |
| 2001/0020290 A1 | * | 9/2001 | Lam et al. ..................... | 716/7 |
| 2002/0016950 A1 | * | 2/2002 | Sakamoto ...................... | 716/6 |
| 2002/0021135 A1 | * | 2/2002 | Li et al. ........................ | 324/677 |

OTHER PUBLICATIONS

"Modeling the RC–Interconnect Effects in a Hierarchical Timing Analyzer"; Ratziaff, C, Pullela, S., Pillage, L; IEEE 1992 Custom Integrated Circuit Conference, p 15.6.1–15.6.4, 1992.*

Ratzlaff et al., "Modeling the RC–Interconnect Effects in a Hierarchical Timing Analyzer", IEEE 1992 Custom Integrated Circuits Conference.

* cited by examiner

*Primary Examiner*—Matthew Smith
*Assistant Examiner*—Sun James Lin
(74) *Attorney, Agent, or Firm*—Antonelli, Terry, Stout & Kraus, LLP

(57) ABSTRACT

There is provided a delay calculation method considering a shield effect applicable to delay calculation for a semiconductor integrated circuit having a plurality of electronic circuit cells and a plurality of wires.

A method for replacing a circuit connected to the output pin of an electronic circuit cell by one effective capacitance to calculate a delay in the electronic circuit cell, comprising procedure (111) which inputs a load parameter in which a circuit connected to the output pin is expressed by an equivalent circuit including resistances and capacitances or inductances, procedure (101) which calculates voltage of capacitance node of the equivalent circuit at transition time until the voltage of the output pin reaches a definition voltage for delay, procedure (103) which calculates the effective capacitance from the voltage of the capacitance node, and procedure (104) which calculates a delay (112) in the electronic circuit cell from the effective capacitance.

This can calculate a delay in a semiconductor integrated circuit fast with high accuracy.

13 Claims, 12 Drawing Sheets

FIG.7

CELL LIBRARY

| CELL TYPE (701) | PIN NAME (702) | EDGE (703) | DELAY PARAMETER (704) | | | | TRANSITION TIME PARAMETER (705) | | | |
|---|---|---|---|---|---|---|---|---|---|---|
| | | | a1 | b1 | c1 | d1 | a2 | b2 | c2 | d2 |
| INV | A→Z | RISE | 0.03 | 1.12 | 0.19 | 21 | 0.02 | 1.21 | 0.24 | 5 |
| | | FALL | 0.02 | 0.95 | −0.01 | 19 | 0.01 | 1.05 | 0.20 | 2 |
| NAND2 | A1→Z | RISE | 0.04 | 1.23 | 0.22 | 35 | 0.03 | 1.52 | 0.30 | 8 |
| | | FALL | 0.03 | 1.16 | 0.05 | 26 | 0.02 | 1.38 | 0.28 | 7 |
| | A2→Z | RISE | 0.05 | 1.28 | 0.28 | 41 | 0.05 | 1.68 | 0.42 | 11 |
| | | FALL | 0.04 | 1.20 | 0.09 | 32 | 0.04 | 1.52 | 0.35 | 8 |
| ⋮ | ⋮ | ⋮ | ⋮ | ⋮ | ⋮ | ⋮ | ⋮ | ⋮ | ⋮ | ⋮ |

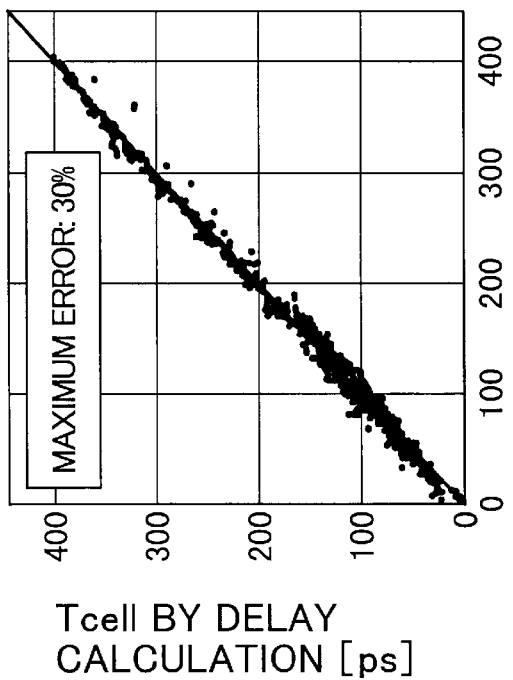
FIG.8A TOTAL LOAD CAPACITANCE
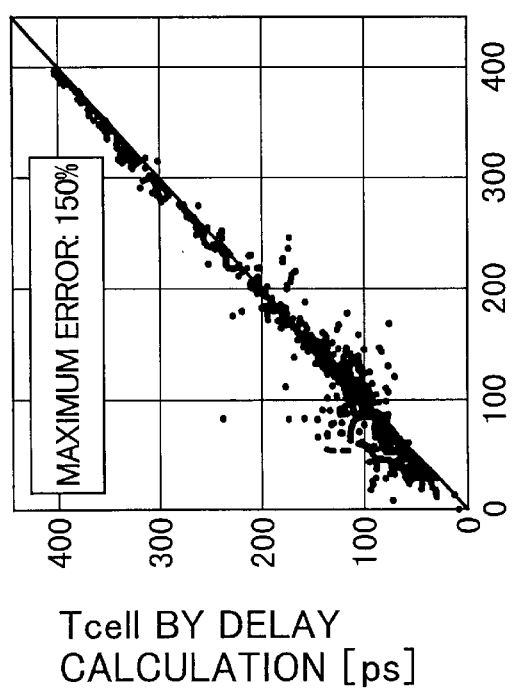
FIG.8B EFFECTIVE CAPACITANCE

ONE TIME STRENGTH

TWO TIMES STRENGTH

THREE TIMES STRENGTH

DELAY CALCULATION METHOD AND DESIGN METHOD OF A SEMICONDUCTOR INTEGRATED CIRCUIT

BACKGROUND OF THE INVENTION

1. Field of the Invention

The present invention relates to a method for calculating a delay in a semiconductor integrated circuit and a design method using the same, more specifically, to a delay calculation method effective to be applied when an electronic computer is used to design a semiconductor integrated circuit and a design method using the same.

2. Description of the Related Art

In designing a complicated semiconductor integrated circuit, delay calculation is very important and, in order to design a high-performance semiconductor integrated circuit, a delay calculation method which performs fast processing with high accuracy is required. In addition, in designing a huger semiconductor integrated circuit, logic synthesis and optimization procedure using a computer are performed. Such procedures require a delay calculation method which performs fast processing with high accuracy.

A total load capacitance has been generally used to calculate a cell delay in such an optimization procedure. In other words, it is a method for calculating a cell delay using a value obtained by summing all capacitance values connected to an output pin.

The technique for processing a semiconductor integrated circuit has been made finer. As a result, there is synergy between an increase in cell drivability and an increase in interconnect resistance so as to increase a "shield effect" in which the load capacitance of an output pin appears to be smaller than the total load capacitance. The prior art delay calculation method using a total load capacitance causes a large error.

To consider this shield effect, a method for replacing a load by one effective capacitance is known. This is discussed in detail in 15.6.1 to 15.6.4 of Proceeding Custom Integrated Circuit Conference, 1992.

However, the prior art method for replacing a load by one effective capacitance to calculate a delay is a calculation method limiting to a π-model load. A general load cannot be calculated directly.

In addition, the prior art method for replacing a load by one effective capacitance to calculate a delay is not given sufficient consideration to fast processing, and is inapplicable to a procedure for enormously executing a delay calculation procedure such as an optimization procedure.

In this way, since the shield effect cannot be considered in the prior art optimization procedure, accurate optimization has not been done for accuracy.

Accordingly, a first object of the present invention is to provide a delay calculation method which can calculate an effective capacitance using a general load form.

In addition, a second object of the present invention is to provide a delay calculation method which permits fast processing.

Further, a third object of the present invention is to provide a design method of a semiconductor integrated circuit using an optimization procedure of the delay calculation method which performs fast processing with high accuracy.

SUMMARY OF THE INVENTION

To achieve the first object, a delay calculation method according to the present invention of a semiconductor integrated circuit having a plurality of electronic circuit cells and a plurality of wires, in which a circuit connected to the output pin of an electronic circuit cell is replaced by one effective capacitance to calculate a delay in the electronic circuit cell, the delay calculation method, as described later using FIG. 1, comprises, after a circuit connected to the output pin is expressed by an equivalent circuit including resistances and capacitances or inductances, procedure 101 which calculates transition time until voltage of the output pin reaches a definition voltage for delay, procedure 102 which calculates voltage of capacitance node of the equivalent circuit at the transition time, procedure 103 which calculates the effective capacitance from the voltage of capacitance node, and procedure 104 which calculates a delay in the electronic circuit cell from the effective capacitance.

To achieve the second object, a delay calculation method according to the present invention of a semiconductor integrated circuit having a plurality of electronic circuit cells and a plurality of wires, in which a circuit connected to the output pin of an electronic circuit cell is replaced by one effective capacitance to calculate a delay in the electronic circuit cell, the delay calculation method, as described later using FIG. 2, comprises, after a circuit connected to the output pin is expressed by an equivalent circuit including resistances and capacitances or inductances, procedure 201 which calculates output transition time until voltage of the output pin reaches the definition voltage for delay, procedure 202 which calculates capacitance node transition time until voltage of capacitance node in the equivalent circuit reaches the definition voltage for delay, procedure 203 which calculates the effective capacitance from the output transition time and the capacitance node transition time, and procedure 204 which calculates a delay in the electronic circuit cell from the effective capacitance.

To achieve the third object, a design method of a semiconductor integrated circuit having a plurality of electronic circuit cells, as described later using FIG. 9, comprises delay calculation procedure 901 which calculates a delay in the electronic circuit cell, judgment procedure 902 which judges whether desired conditions are met, and cell modification procedure 903 which modifies the type or a combination of the electronic circuits, in which the type or a combination of the electronic circuit cells is selected so as to meet the desired conditions, the design method wherein the delay calculation procedure 901 uses the delay calculation method using the effective capacitance calculation method.

In the delay calculation method of a semiconductor integrated circuit having a plurality of electronic circuit cells and a plurality of wires, an interconnect delay calculation method comprises a first procedure which calculates output transition time TT1 of the cell from total load capacitance Ct obtained by summing capacitance values connected to the output of the electronic circuit cell, a second procedure which calculates temporary interconnect delay Tw0 from interconnect resistance Rw and interconnect capacitance Cw of the wire connected to the electronic circuit cell and input capacitance Cci of the electronic circuit cell as a load connected, and a third procedure which calculates interconnect delay Tw from the output transition time TT1 and the temporary interconnect delay Tw0 by the following expression:

$$Tw = Tw0 \cdot [1 - \exp\{-(a1 \cdot Tw0 + a2 \cdot TT1)/Tw0\}]$$

In the delay calculation method of a semiconductor integrated circuit having a plurality of electronic circuit cells and a plurality of wires, an interconnect delay calculation method comprises a first procedure which calculates output transition time TT1 of the cell from total load capacitance Ct obtained by summing capacitance values connected to the output of the electronic circuit cell, a second procedure which calculates output transition time TT2 of the cell from effective capacitance Ceff effective as output load capacitance of the electronic circuit cell, a third procedure which calculates temporary interconnect delay Tw0 from interconnect resistance Rw and interconnect capacitance Cw of the wire connected to the electronic circuit cell and input capacitance Cci of the electronic circuit cell as a load connected, and a fourth procedure which calculates interconnect delay Tw from the output transition time TT1, the output transition time TT2, and the temporary interconnect delay Tw0 by the following equation:

$$Tw = Tw0 + (b1 \cdot TT1 - b2 \cdot TT2 - Tw0) \cdot \exp\{-(b3 \cdot Tw0 + b4 \cdot TT1)/Tw0\}$$

The foregoing objects and other objects of the present invention will be apparent by the following detailed description and the appended claims with reference to the accompanying drawings. In the accompanying drawings, like or similar parts are identified by the same reference numerals.

BRIEF DESCRIPTION OF THE DRAWINGS

FIG. 7 is a diagram showing the construction example of a cell library shown in FIG. 6;

FIG. 8A is a diagram showing calculation accuracy of a prior art delay calculation method;

FIG. 8B is a diagram showing calculation accuracy of the delay calculation method of the present invention;

DETAILED DESCRIPTION OF THE PREFERRED EMBODIMENTS

<Embodiment 1>

Figure 1:
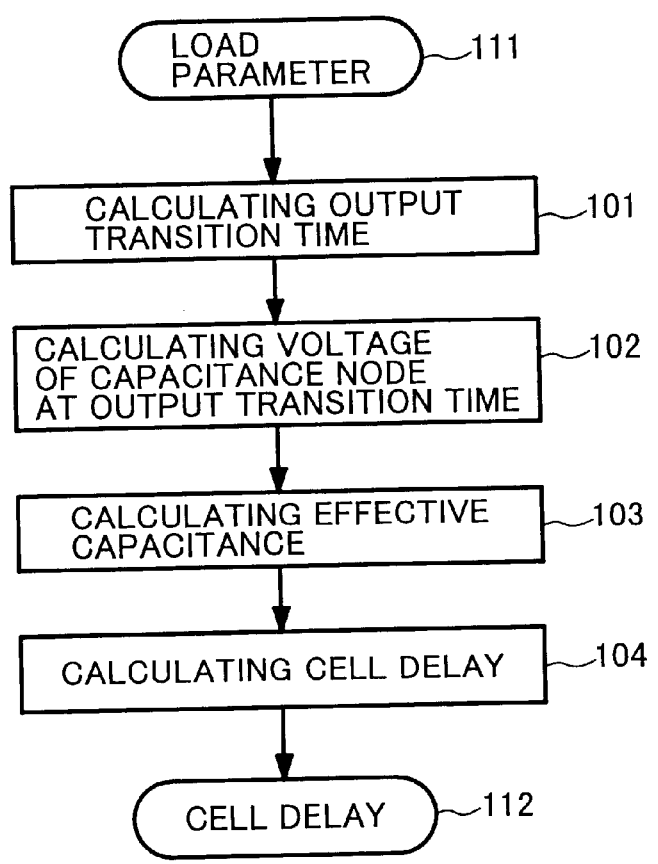
FIG. 1 is a procedure diagram showing one embodiment of a delay calculation method of the present invention.

FIG. 1 shows a procedure for a delay calculation method as one embodiment of the present invention. This is a procedure for a cell delay calculation method of a semiconductor integrated circuit having electronic circuit cells (hereinafter, referred to as a "cell") generally known as an electronic circuit element constructing the semiconductor integrated circuit and wires connecting them.

In this procedure, a load parameter 111 in which a circuit connected to an output pin is expressed as an equivalent circuit including resistances and capacitances or inductances is first inputted.

In procedure 101, an output transition time calculation procedure is performed to calculate transition time until voltage of the output pin reaches a definition voltage for delay.

Then, procedure 102 calculates voltage of capacitance node of the equivalent circuit at the output transition time.

Further, procedure 103 calculates an effective capacitance from the voltage value of the capacitance node and the capacitance value of the capacitance connected.

Finally, procedure 104 calculates a cell delay from the effective capacitance, thereby obtaining a cell delay 112.

The above-mentioned procedures will be described with reference to a specific circuit example.

Figure 3:
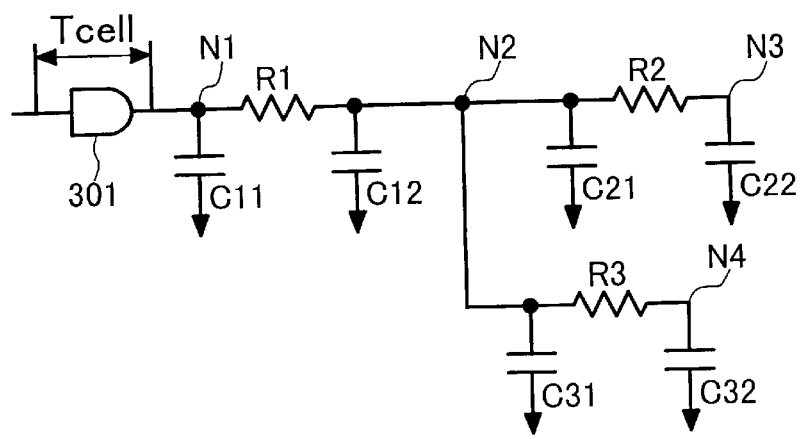
FIG. 3 is an output load circuit of assistance in explaining the delay calculation method of the present invention.

FIG. 3 shows an example of an equivalent circuit connected to an output pin. The delay in a cell 301 is calculated as shown below. Here, a supply voltage is VDD, and a definition voltage for delay is VDD/2. The case that an output voltage is increased from 0 to VDD will be described hereinbelow. The case that the output voltage is decreased from VDD to 0 can be calculated likewise.

The procedure 101 first calculates transition time until the output voltage of the cell 301 is increased from 0 to VDD/2. This can be calculated using a library after, for example, previously obtaining values corresponding to various load forms by circuit simulation so as to be stored as the library.

The procedure 102 then calculates voltages of nodes N1, N2, N3 and N4 connected to the capacitances at the transition time calculated in the procedure 101. Here, the node N1 is an output pin and VDD/2, but the values of the nodes N2, N3 and N4 are smaller than VDD/2 due to voltage drop of resistances R1, R2 and R3. These values can be calculated by, for example, solving a circuit equation from the resistance values and capacitance values.

The procedure 103 calculates effective capacitance Ceff. This can be calculated using the following equation $$Ceff = C11 + (C12 + C21 + C31)\frac{2 \cdot Vc2}{VDD} + C22\frac{2 \cdot Vc3}{VDD} + C32\frac{2 \cdot Vc4}{VDD} \quad (1)$$

where the voltages of the nodes N2, N3 and N4 at the transition time until the output voltage of the cell 301 is increased from 0 to VDD/2 are respectively VC2, VC3 and VC4.

The procedure 104 calculates a cell delay using the effective capacitance Ceff calculated in the procedure 103. When, for example, a cell delay is Tcell, this can be calculated using the expression Tcell=k1·Ceff+k2. Here, k1 and k2 values are obtained previously for each cell by circuit simulation so as to be stored as a library. The delay calculation procedure can be executed fast.

In the present invention, generally, when the definition voltage for delay is Vd, the capacitance node voltage is Vci, and the capacitance value of the capacitance is Ci, the effective capacitance Ceff can be calculated by the following equation (2):

$$Ceff = \sum_i Ci \frac{Vci}{Vd} \quad (2)$$

With this equation, the reason why the equivalent circuit can be replaced by one effective capacitance will be explained.

When the total capacitance value of the equivalent circuit is Ct, the sum Qt of electric currents flowing from the output pin can be expressed as Qt=Ct·VDD by the relational expression Q=C·V. Here, in the case of the equivalent circuit shown in FIG. 3, Ct=C11+C12+C21+C22+C31+C32. Thus, Ct has been used to express the equivalent circuit as one capacitance value.

However, since the cell delay is determined by an electric current flowing up to the definition voltage for delay, a capacitance value needed to calculate the cell delay must be expressed one capacitance value equal to the sum of the electric current values flowing up to the definition voltage for delay. The sum of the electric current values flowing up to the definition voltage for delay can be calculated by voltage of the capacitance when the cell output voltage reaches the definition voltage for delay. In other words, the capacitance value may be expressed by one capacitance in which an electric current equal to the electric current flowing while the cell output voltage reaches the definition voltage for delay is flowed, and the expression is the equation (2).

The present invention can perform delay calculation considering the shield effect in which a load capacitance appears to be small due to the influence of interconnect resistance. According to the present invention, the load form needs not be the π-model load, and an equivalent circuit with a general load can be calculated directly. In other words, the high-accuracy delay calculation method of the present invention considering the shield effect is used to design a high-performance semiconductor integrated circuit.

<Embodiment 2>

Figure 2:
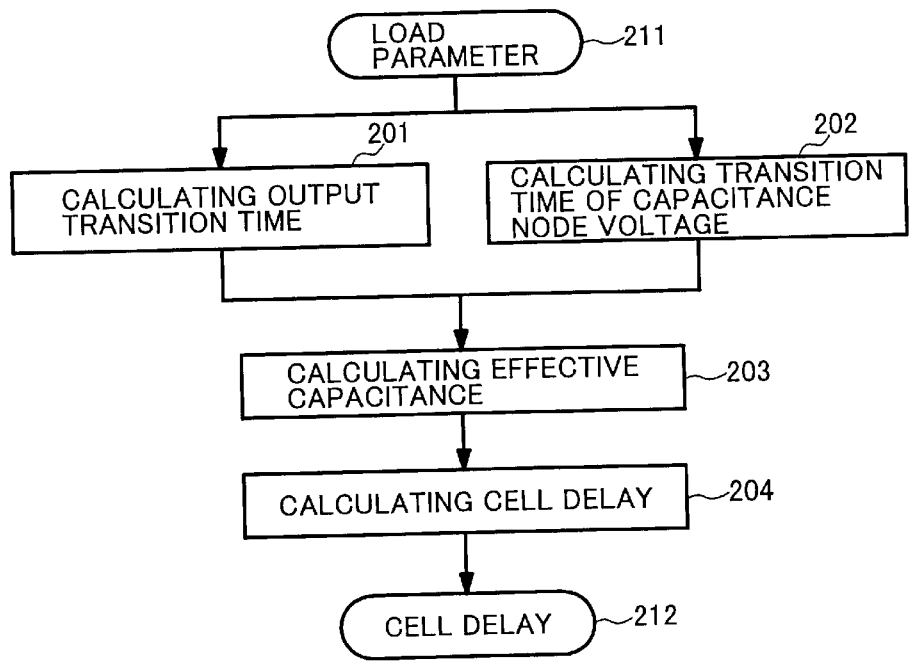
FIG. 2 is a procedure diagram showing another embodiment of the delay calculation method of the present invention.

FIG. 2 shows a procedure illustrating another embodiment of the delay calculation method according to the present invention, which is a cell delay calculation method of a semiconductor integrated circuit having a plurality of cells and wires connecting them.

In this procedure, a load parameter 211 in which a circuit connected to an output pin is expressed as an equivalent circuit including resistances and capacitances or inductances is first inputted.

In procedure 201, an output transition time calculation procedure is performed to calculate transition time until voltage of the output pin reaches a definition voltage for delay.

On the other hand, procedure 202 calculates transition time until the capacitance node voltage of the equivalent circuit reaches the definition voltage for delay, i.e., a capacitance value.

Further, procedure 203 is performed to calculate an effective capacitance from the capacitance node voltage transition time obtained in the procedures 201 and 202 and the capacitance value of the capacitance connected.

Finally, procedure 204 calculates a cell delay from the effective capacitance obtained in the procedure 203, thereby giving cell delay 212.

The above-mentioned procedures will be explained with reference to the specific circuit example of FIG. 3.

The delay in the cell 301 can be calculated as shown below. Here, a supply voltage is VDD, and a definition voltage for delay is VDD/2. The case that an output voltage is increased from 0 to VDD will be described hereinbelow. The case that the output voltage is decreased from VDD to 0 can be calculated likewise.

The procedure 201 first calculates transition time until the output voltage of the cell 301 is increased from 0 to VDD/2. This can be calculated using Ron Ct when the driver output resistance of the cell is Ron and the sum of all capacitance values connected to the output pin is Ct. Here, Ct=C11+C12+C21+C22+C31+C32. In addition, Ron may be obtained previously for each cell by circuit simulation.

Then, the procedure 202 calculates capacitance node voltage transition time. When output transition time is To, and delay time from the output pin to the capacitance node is Tdi, capacitance node transition time Ti can be calculated as Ti=To+Tdi.

When the delays from the output pin to the nodes N1, N2, N3 and N4 are respectively Td1, Td2, Td3 and Td4, the respective delays can be obtained from the expressions Td1=0, Td2=R1·(C12+C21+C22+C31+C32), Td3=Td2+R2·C22, and Td4=Td2+R3·C32.

The procedure 203 calculates effective capacitance Ceff. This is calculated approximately by, for example, the following equation (3):

$$Ceff = C11 + (C12 + C21 + C31)\frac{Ron \cdot Ct}{Ron \cdot Ct + Td2} + \quad (3)$$
$$C22\frac{Ron \cdot Ct}{Ron \cdot Ct + Td3} + C32\frac{Ron \cdot Ct}{Ron \cdot Ct + Td4}$$

The procedure 204 calculates a cell delay using the effective capacitance Ceff calculated in the procedure 203. When, for example, the cell delay is Tcell, this can be calculated using the expression Tcell=k1·Ceff+k2. Here, k1 and k2 values are obtained previously for each cell by circuit simulation so as to be stored as a library. The delay calculation procedure can be executed fast.

In the present invention, generally, when the driver output resistance is Ron, the sum of all capacitance values connected to the output pin is Ct, the delay from the output pin to the node connected to the capacitance is Tdi, and the capacitance value of the capacitance is Ci, the effective capacitance Ceff can be calculated approximately by the following equation (4):

$$Ceff = \sum_i Ci \frac{Ron \cdot Ct}{Ron \cdot Ct + Tdl} \quad (4)$$

With this equation (4), the reason why the equivalent circuit can be replaced by one effective capacitance will be explained.

When the total capacitance value of the equivalent circuit is Ct, the sum Qt of electric currents flowing from the output pin can be expressed as Qt=Ct·VDD by the relational expression Q=C·V. Thus, Ct has been used to express the equivalent circuit as one capacitance value.

However, since the cell delay is determined by an electric current flowing up to the definition voltage for delay, a capacitance value needed to calculate the cell delay must be expressed one capacitance value equal to the sum of the electric current values flowing up to the definition voltage for delay. The sum of the electric current values flowing up to the definition voltage for delay can be calculated by voltage of the capacitance when the cell output voltage reaches the definition voltage for delay. Here, the voltage of the capacitance can be approximately expressed by the delay from the output pin to the capacitance. In other words, the capacitance value may be expressed by one capacitance in which an electric current equal to the electric current flowing while the cell output voltage reaches the definition voltage for delay is flowed, and the expression is the equation (4).

Figure 4:
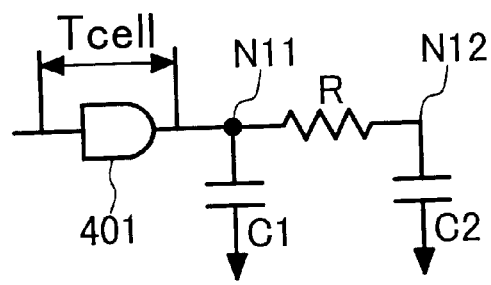
FIG. 4 is another output load circuit of assistance in explaining the delay calculation method of the present invention.

To consider the shield effect, as the prior art method for replacing a load by one effective capacitance, the equation for calculating an effective capacitance discussed in 15.6.1 to 15.6.4 of the Proceeding Custom Integrated Circuit Conference, 1992, a π-model circuit having a cell 401, resistance R, and capacitances C1 and C2, as shown in FIG. 4 needs seven additions, seven subtractions, twelve multiplications, four divisions, and two exponential calculations.

With respect to this, in the calculation method of the present invention, the π-model circuit as shown in FIG. 4 can be obtained only by three additions, three subtractions, three multiplications, and one division. Since, in particular, the number of the divisions or exponential calculations requiring long operation time is small, the calculation method of the present invention can be processed ten times or more faster than the prior art calculation method.

The present invention can perform delay calculation considering the shield effect in which a load capacitance appears to be small due to the influence of interconnect resistance. In addition, there is no severe limitation to the load form so that an equivalent circuit with a general load can be calculated directly. Further, the delay from the output pin to the capacitance is a value capable of being obtained when calculating an interconnect delay. These values are used so that the number of the calculation procedures added to calculate an effective capacitance is very small, thereby performing delay calculation fast. In other words, the high-accuracy delay calculation method of the present invention is used in design of a high-performance semiconductor integrated circuit for a short period of time.

The equation (4) is an equation for approximately obtaining an effective capacitance. The effective capacitance Ceff calculated using the equation (4) is replaced by the total load capacitance Ct for re-calculation to improve the accuracy of the effective capacitance. This can be executed as a repeating procedure until the effective capacitance is converged.

When the present invention is applied to the π-model load as shown in FIG. 4, Ceff=Ct is used to solve the equation (4), so that the effective capacitance Ceff can be obtained by the following equation (5):

$$Ceff = \frac{1}{2}\left[ C1 + \left(1 - \frac{R}{Ron}\right) \cdot C2 + \sqrt{\left\{C1 + \left(1 - \frac{R}{Ron}\right) \cdot C2\right\}^2 + 4\frac{R}{Ron}C1 \cdot C2} \right] \quad (5)$$

This can calculate the effective capacitance with high accuracy.

<Embodiment 3>

Figure 5:
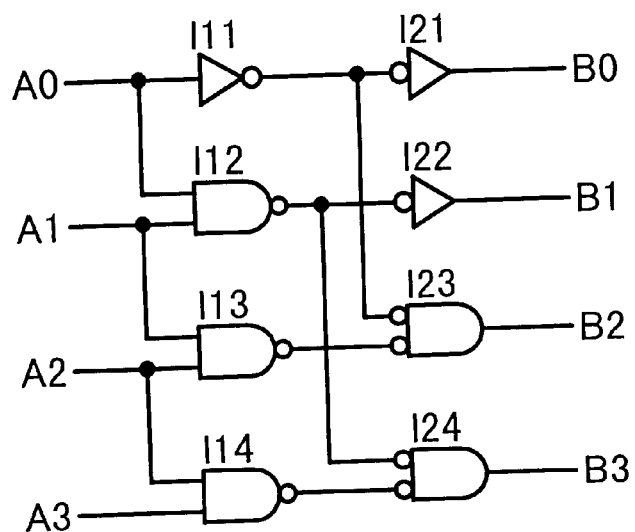
FIG. 5 is a logic circuit diagram of assistance in explaining the delay calculation method of the present invention.

The delay calculation method in the logic circuit shown in FIGS. 1 and 2 of the present invention will be explained using the logic circuit example shown in FIG. 5. The delays of all combinations of inputs A0, A1, A2 and A3 to outputs B0, B1, B2 and B3 are calculated.

First, the input A0 is a starting point to calculate a delay in a cell I11. The load equivalent circuit of the cell I11 is expressed by the input capacitance of a cell I21, the input capacitance of a cell I23, and the resistance and capacitance of wires connecting them. It is used to perform the effective capacitance calculation of the present invention, thereby calculating the delay in the cell I11.

The delay in the cell I21 is calculated likewise to calculate a delay passing through A0, I11, I21 and B0.

The delays for all the paths can be calculated likewise. The cell is described here and the interconnect delay calculation method will be described later in Embodiment 8.

The delay calculation method of the present invention can be executed as a program operating, e.g., on an electronic computer.

<Embodiment 4>

Figure 6:
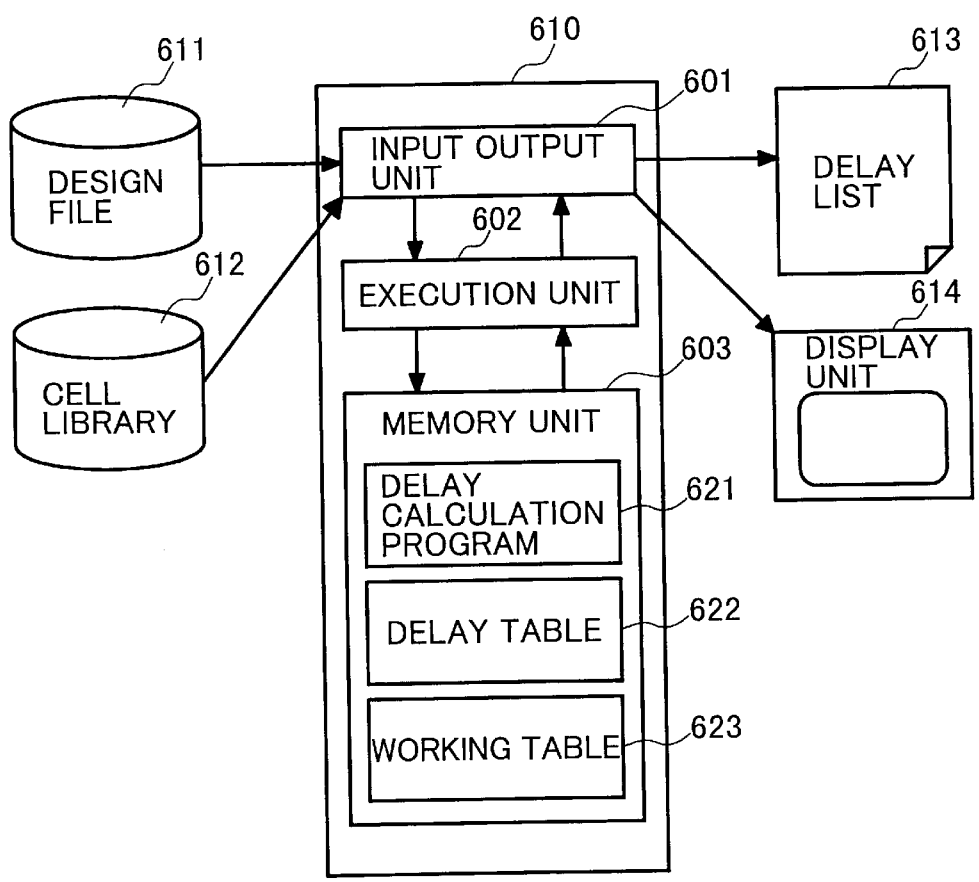
FIG. 6 is a block diagram showing the construction example of a computer executing the delay calculation method of the present invention.

FIG. 6 is an overview construction diagram of a system as one example of the present invention. Here, the reference numeral 610 denotes a processor, the reference numeral 611 denotes a design file showing the relation to connect cells, the reference numeral 612 denotes a cell library for previously obtaining a delay parameter for each cell by circuit simulation, the reference numeral 613 denotes a delay list showing results obtained by executing delay calculation, the reference numeral 614 denotes a display unit for the results obtained by executing delay calculation, the reference numeral 601 denotes an input output unit, the reference numeral 602 denotes an execution unit, and the reference numeral 603 denotes a memory unit. In addition, the numeral 621 denotes a delay calculation program region in the memory unit 603, the numeral 622 denotes a delay table region, and the numeral 623 denotes a working table region.

The delay calculation method of the present invention is stored into the delay calculation program region 621 as a program. The input output unit 601 reads the design file 611 and the cell library 612. The execution unit 602 performs an operation procedure in accordance with the delay calculation program. For this operation result, the input output unit 601 outputs the delay list 613 and/or the display unit 614 displays the delay list.

An electronic computer is used to process the delay calculation method of the present invention fast.

FIG. 7 is a construction example of the cell library 612 in FIG. 6. In the drawing, the reference numerals 701, 702, 703, 704 and 705 denote items of the library, and respectively show cell types, pin names, edges, delay parameters, and transition time parameters. The cell delay is different depending on the cell type, the pin, and the edge in which the output is a rise or fall. The parameters are defined under the respective conditions.

As the equation for obtaining the cell delay Tcell using the effective capacitance Ceff, the above-mentioned expression Tcell=k1·Ceff+k2 can be also used. However, the cell delay depends on input transition time TI. The following expression considering the input transition time TI is used:

$$Tcell = a1 \cdot Ceff \cdot TI + b1 \cdot Ceff + c1 \cdot TI + d1$$

This expression permits higher-accuracy calculation. Here, the input transition time is defined as, for example, time until the input voltage reaches from 0 to VDD/2, time until the input voltage reaches from VDD to VDD/2, or time until the input voltage transits from 0.2·VDD to 0.8·VDD.

Parameters a1, b1, c1 and d1 used in this calculation are stored into an item 704 for each cell type, each pin, and each edge. These parameters may be obtained previously using circuit simulation. In the above-mentioned calculation method, the input transition time of the next gate stage must be calculated at the same time. Similar to the delay time, the input transition time of the next gate stage is TIN which is calculated using the following expression:

$$TIN = a2 \cdot Ceff \cdot TI + b2 \cdot Ceff + c2 \cdot TI + d2$$

TIN is used as the input transition time at the delay calculation of the next gate stage.

The parameters a2, b2, c2 and d2 used in this calculation are stored into an item 705 for each cell type, each pin, and each edge. Likewise, these parameters may be obtained previously using circuit simulation.

Using this cell library construction method, the delay calculation method of the present invention can be executed fast with high accuracy.

FIGS. 8(*a*) and (*b*) show effects of improving calculation accuracy according to the present invention and respectively show the case that the prior art delay calculation method is used to calculate a cell delay using the total load capacitance without considering the shield effect, and the case that the delay calculation method of the present invention is used to calculate a cell delay using the effective capacitance. The horizontal axis shows delay Tcell obtained by circuit simulation, and the vertical axis shows delay Tcell calculated by the respective calculation methods, in which a value of an actual logic block is plotted for each cell.

In FIG. 8(*a*), in the prior art calculation method, the maximum calculation error is 150%, and when the method is used for designing an actual semiconductor integrated circuit, correct design cannot be apparently performed. On the other hand, in FIG. 8(*b*), in the delay calculation method of the present invention, the maximum calculation error is 30% which can be 1/5 times the prior art calculation error, so that a semiconductor integrated circuit can be designed correctly.

Thus, the delay calculation method of the present invention is used to design a high-performance semiconductor integrated circuit.

<Embodiment 5>

The method for designing a semiconductor integrated circuit will be explained hereinbelow.

Figure 9:
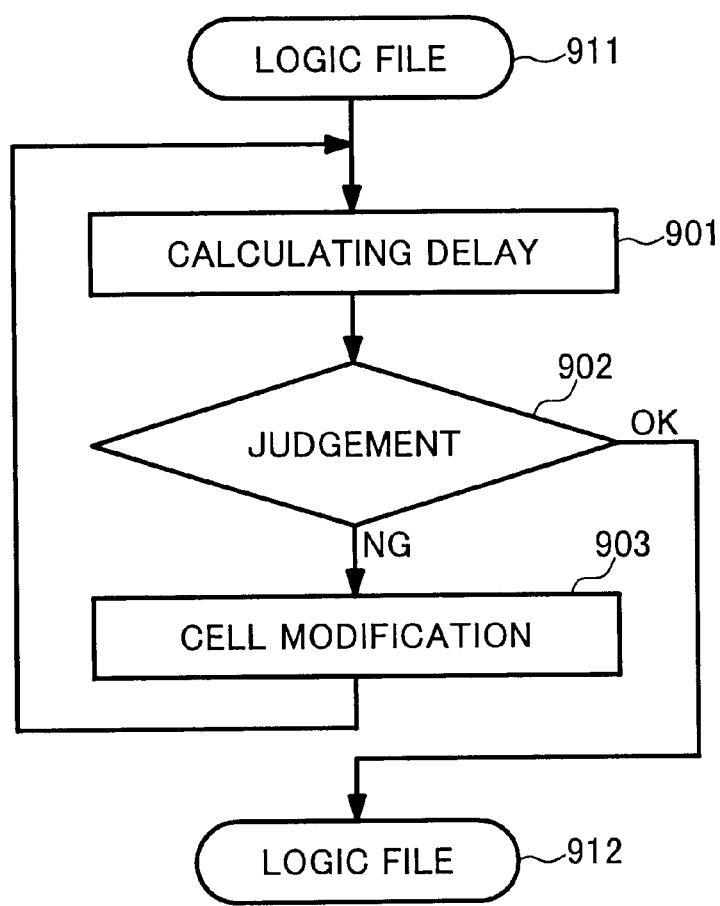
FIG. 9 is a procedure diagram showing one embodiment of a design method of a semiconductor integrated circuit according to the present invention.

FIG. 9 shows a procedure of a method for designing a semiconductor integrated circuit showing one embodiment of the present invention. This embodiment can modify a cell so as to meet desired conditions when the delay calculation method of the present invention is applied to the method for designing a semiconductor integrated circuit having a plurality of cells.

In this procedure, a logic file 911 including information of cells constructing logic and wires connecting them is first inputted.

Procedure 901 performs delay calculation, and procedure 902 performs judgment. In the case of NG in which the desired conditions are not met in the judgment procedure, the routine is advanced to procedure 903 for performing a cell modification procedure to return to the procedure 901. The routine is repeated until the desired conditions are met in the judgment procedure 902 to be OK. This can obtain a logic file 912 meeting the desired conditions.

Here, the desired conditions are conditions in which, for example, the path delay passing through all the paths is shorter than the target delay.

In the cell modification procedure, to obtain the desired delay, for example, the cell size is switched, a cell having high drivability is inserted when a large load is driven, or the connection relation is modified to reduce the load. In the cell size switching, the cells having the same logic function and different drivability are exchanged. The cell having different drivability using e.g., a field-effect transistor can be realized by modifying the size of the gate width W of the transistor. When a load connected to the output pin is large, the drivability is increased, and when the load is small, the drivability is decreased. The desired delay can be thus obtained.

When a large semiconductor integrated circuit is targeted, the procedures 901, 902 and 903 must be repeated the enormous number of times exceeding 1,000,000 times, and the delay calculation procedure 901 requires fast processing. Unless the accuracy of the delay calculation is high, the obtained logic file 912 is not correct. When a semiconductor integrated circuit is actually manufactured, the desired conditions cannot be met.

However, the delay calculation method of the present invention of the above-mentioned Embodiment 1 or 2 is used for the delay calculation procedure 901. The cell modification procedure can be executed fast with high accuracy. In addition, the method for designing a semiconductor integrated circuit according to the present invention can be processed fast using an electronic computer.

<Embodiment 6>

Figure 10:
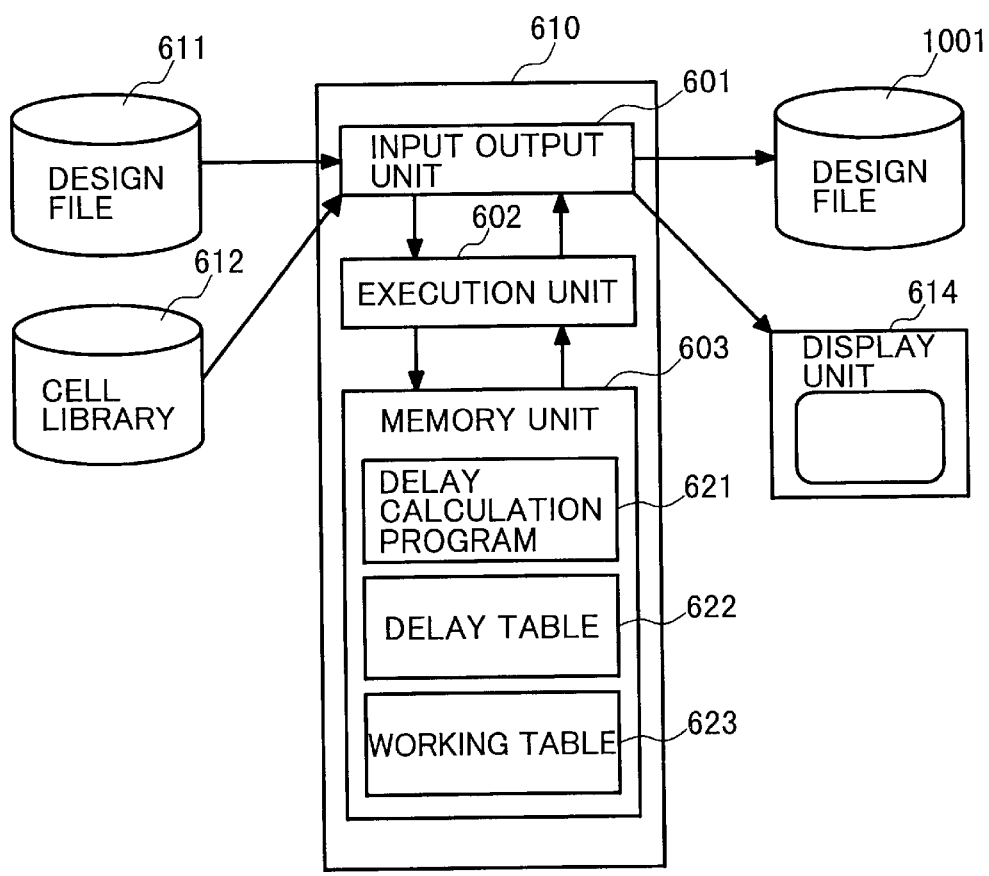
FIG. 10 is a block diagram showing the construction example of a system executing the design method of a semiconductor integrated circuit according to the present invention.

FIG. 10 is an overview block diagram showing one example of a system executing the method for designing a semiconductor integrated circuit according to the present invention. Here, the reference numeral 610 denotes a processor, the reference numeral 611 denotes a design file showing the relation to connect cells, the reference numeral 612 denotes a cell library, the reference numeral 1001 denotes a design file in which the design file 611 is modified to meet the desired conditions, the reference numeral 614 denotes a display unit, the reference numeral 601 denotes an input output unit, the reference numeral 602 denotes an execution unit, and the reference numeral 603 denotes a memory unit. In addition, the numeral 621 denotes a delay calculation program region in the memory unit 603, the numeral 622 denotes a delay table region, and the numeral 623 denotes a working table region.

The method for designing a semiconductor integrated circuit according to the present invention is stored into the delay calculation program region 621 as a program. The input output unit 601 reads the design file 611 and the cell library 612. The execution unit 602 performs a logic file modification procedure in accordance with the delay calculation program of the flow shown in FIG. 9. The input output unit 601 outputs the design file 1001 after modification.

Figure 11A:
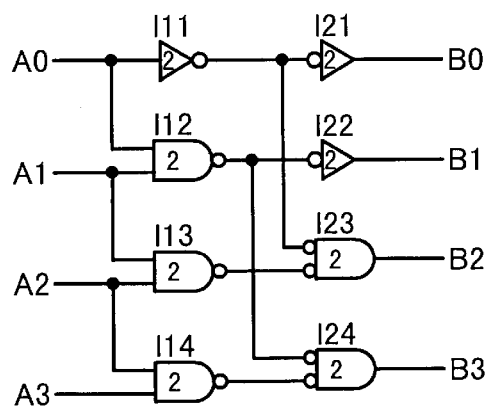
FIG. 11 is a logic circuit diagram of assistance in explaining the design method of a semiconductor integrated circuit according to the present invention.
Figure 11B:
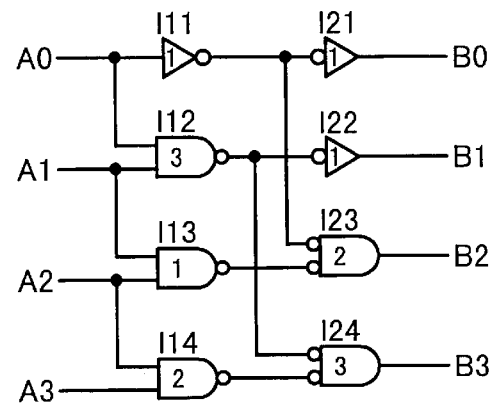

Using the specific circuit example shown in FIG. 11, the method for designing a semiconductor integrated circuit according to the present invention when the desired conditions are achieved by switching the cell size will be explained. The cell size has three kinds of one time strength, two times strength, and three times strength. All the original design files use two times strength cells.

Figure 12A:
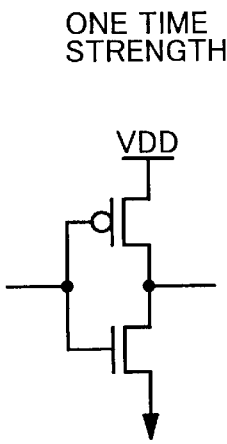
FIG. 12 is a cell circuit diagram of assistance in explaining the design method of a semiconductor integrated circuit according to the present invention.
Figure 12B:
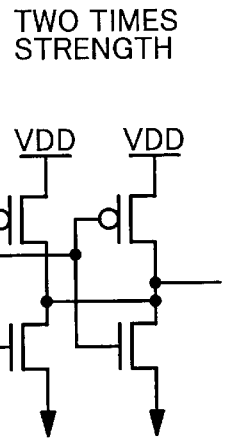
Figure 12C:
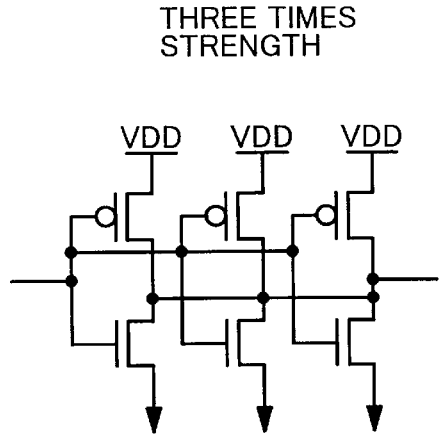

FIGS. 12(a), (b) and (c) are diagrams showing inverter size for use in the cell I11 and are circuit examples of one time strength, two times strength, and three times strength, respectively. All have the same functions. In the two times strength cell, two pieces of one time strength cells are arranged in parallel. In three times strength cell, three pieces of one time strength cells are arranged in parallel. Thus, the drivability is increased to two or three times, respectively. The 2-input NAND circuit for use in the cell I12 is also arranged in parallel to construct one time, two times, and three times strength.

The aimed conditions are that the delay of all the combinations of the inputs A0, A1, A2 and A3 to the outputs B0, B1, B2 and B3 meets the target delay.

A delay is obtained from the delay calculation procedure 901 according to the present invention of the flow shown in FIG. 9 to execute the judgment procedure 902. In the judgment result at this time, the path passing through A0, I12, I24 and B3 does not meet the target delay.

The cell size modification procedure 903 increases the size of the cell I12 from 2 to 3 and then, returns to the procedure 901 to execute the delay calculation. In the procedure 902, the path passing through A0, I12, I24 and B0 has not meet the target delay yet.

Again, the cell size modification procedure 903 decreases the size of the cell I22 from 2 to 1 and then, returns to the procedure 901 to execute the delay calculation. The size is decreased to reduce the input capacitance of the cell. The delay of the path passing through A0, I12, I24 and B3 is reduced.

The procedure as described above is executed repeatedly, so that the delay of all the paths can meet the target delay. Further, when the conditions cannot be met after any procedure is performed, a procedure for stopping the repetition must be added to the judgment procedure 902.

Using the method for designing a semiconductor integrated circuit according to the present invention, it is apparent that the cell size is lowered in the range of meeting the target delay to obtain a logic circuit having low power consumption.

In the delay calculation method of the present invention, extraction of the interconnect capacitance from the actual layout is effective so that the delay calculation result is more precise. The interconnect capacitance is calculated based only on the capacitance per unit length and the wire length under a certain precondition. It is effective for making the procedure fast, but the accuracy is hard to be secured.

<Embodiment 7>

Figure 13:
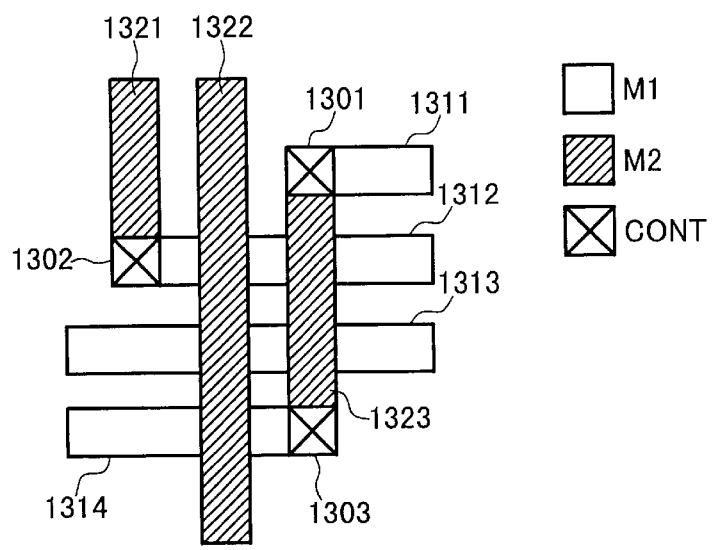
FIG. 13 is a wire layout of assistance in explaining the design method of a semiconductor integrated circuit according to the present invention.

FIG. 13 is an example of wire layout. Here, each reference numerals 1311 to 1314 denotes a metal wire M1 in a layer, each numerals 1321 to 1323 denotes a metal wire M2 in another layer, and each numerals 1301 to 1303 denotes a contact connecting the metal wire M1 and the metal wire M2.

It is apparent that the interconnect capacitance is affected by the peripheral wires. For example, when focusing on the metal wire M2 of the reference numeral 1322, the capacitance is increased by the wires M2 of the numerals 1321 and 1323 in parallel therewith and adjacent thereto in the same layer and the wires M1 of the numerals 1311, 1312, 1313 and 1314 intersected therewith in the other layer. Such adjacent wires and wires intersected in the upper or lower layer are considered to precisely calculate the interconnect capacitance. It is thus possible to make the most of the effect of the delay calculation method of the present invention with high calculation accuracy. In other words, a semiconductor integrated circuit designed by the method for designing a semiconductor integrated circuit according to the present invention correctly meets the desired conditions when the semiconductor integrated circuit is actually manufactured.

The method for designing a semiconductor integrated circuit according to the present invention is executed together with cell arrangement and wire procedures. Needless to say, a higher-performance semiconductor integrated circuit can be designed.

<Embodiment 8>

Figure 15:
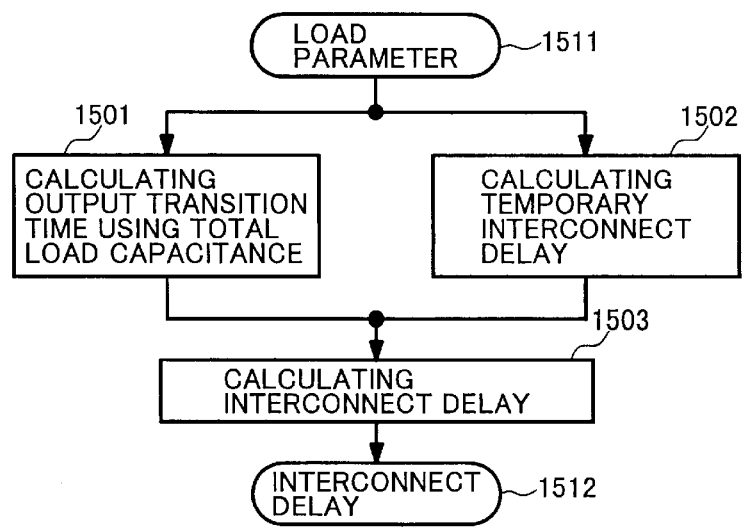
FIG. 15 is a procedure diagram of an interconnect delay calculation method showing one embodiment of the delay calculation method of the present invention.

FIG. 15 shows a procedure illustrating another embodiment of the delay calculation method of the present invention. This embodiment is an interconnect delay calculation method of a semiconductor integrated circuit having a plurality of cells and wires connecting them.

In this procedure, similar to Embodiments 1 and 2, a load parameter 1511 connected to the output pin is first inputted.

Output transition time calculation procedure 1501 is performed to calculate the output transition time TT1 using the total load capacitance of the cell. The procedure 1501 calculates the output transition time TT1 using the following expression:

$$TT1 = k1 \cdot Ct \cdot Ti + k2 \cdot Ct + k3 \cdot Ti + k4$$

where the cell input transition time is Ti, and the total load capacitance is Ct. Here, k1, k2, k3 and k4 are constants previously obtained for each cell by circuit simulation.

On the other hand, in parallel with the procedure 1501, temporary interconnect delay calculation procedure 1502 is performed to calculate temporary interconnect delay Tw0 from the interconnect resistance and the interconnect capacitance of the wire and the input capacitance of the cell as a load. The procedure 1502 calculates Tw0=ΣRi·Ci using the total value of Ri·Ci where the interconnect resistance between the wire contacts is Ri, the total capacitance from the terminal contact between the contacts is Ci.

Finally, interconnect delay calculation procedure 1503 is performed to calculate interconnect delay Tw from the output transition time TT1 using the total load capacitance and the temporary interconnect delay Tw0, thereby, giving an interconnect delay 1512. The procedure 1503 uses the output transition time TT1 using the total load capacitance and the temporary interconnect delay Tw0 to calculate the interconnect delay Tw by the following equation (6). Here, a1 and a2 are constants and, for example, the values of a1=1 and a2=0.5 are used.

$$Tw = Tw0 \cdot \left[1 - \exp\left(-\frac{a1 \cdot Tw0 + a2 \cdot TT1}{Tw0}\right)\right] \qquad (6)$$

According to the delay calculation method of this embodiment, the interconnect delay is corrected by the output transition time to calculate the interconnect delay with high accuracy.

<Embodiment 9>

Figure 16:
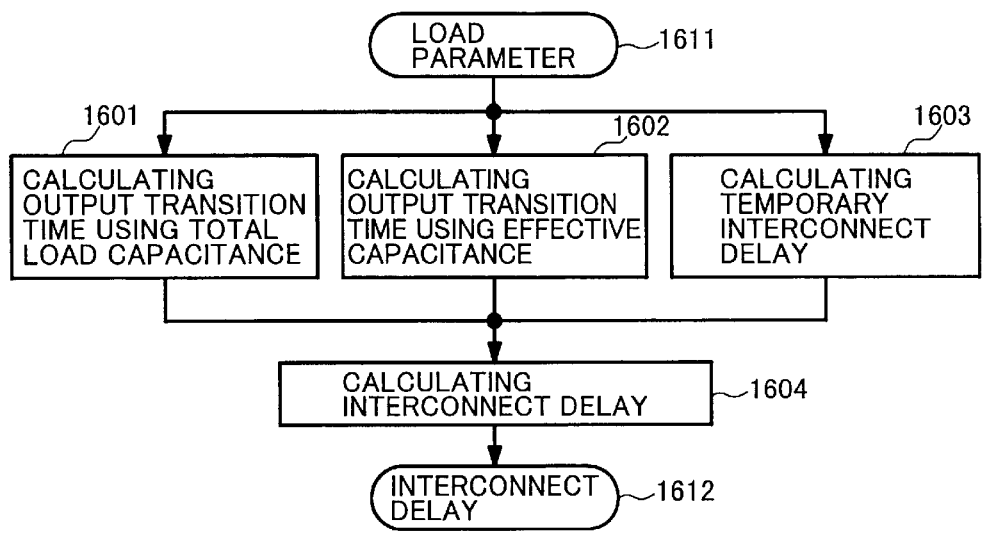
FIG. 16 is a procedure diagram of the interconnect delay calculation method showing another embodiment of the delay calculation method of the present invention.

FIG. 16 illustrates a procedure showing a further embodiment of the delay calculation method of the present invention. This embodiment is an interconnect delay calculation method of a semiconductor integrated circuit having a plurality of cells and wires connecting them.

In this procedure, similar to Embodiment 8, a load parameter 1611 connected to the output pin is first inputted.

Output transition time calculation procedure 1601 by the total load capacitance is performed to calculate the output transition time TT1 using the total load capacitance of the cell. The procedure 1601 calculates the output transition time TT1 using the following expression:

$$TT1 = k1 \cdot Ct \cdot Ti + k2 \cdot Ct + k3 \cdot Ti + k4$$

where the cell input transition time is Ti, and the total load capacitance is Ct. Here, k1, k2, k3 and k4 are constants previously obtained for each cell by circuit simulation.

On the other hand, in parallel with the procedure 1601, output transition time calculation procedure 1602 is performed to calculate the output transition time TT2 using the effective capacitance of the cell. The procedure 1602 calculates the output transition time TT2 using the following expression:

$$TT2 = k1 \cdot Ceff \cdot Ti + k2 \cdot Ceff + k3 \cdot Ti + k4$$

where the cell input transition time is Ti, and the effective capacitance is Ceff. Here, k1, k2, k3 and k4 are constants previously obtained for each cell by circuit simulation.

In addition, in parallel with the procedure 1601, temporary interconnect delay calculation procedure 1603 is performed to calculate temporary interconnect delay Tw0 from the interconnect resistance and the interconnect capacitance of the wire and the input capacitance of the cell as a load. The procedure 1603 calculates Tw0=ΣRi·Ci using the total value of Ri·Ci where the interconnect resistance between the wire contacts is Ri, and the total capacitance from the terminal contact between the contacts is Ci.

Interconnect delay calculation procedure 1604 is performed to calculate the interconnect delay Tw from the output transition time TT1 using the total load capacitance, the output transition time TT2 using the effective capacitance, and the temporary interconnect delay Tw0. This gives an interconnect delay 1612. The procedure 1604 employs the output transition time TT1 using the total load capacitance, the output transition time TT2 using the effective capacitance, and the temporary interconnect delay Tw0 to calculate the interconnect delay Tw by the following equation (7). Here, b1, b2, b3 and b4 are constants and, for example, the values of b1=2, b2=2, b3=1 and b4=0.5 are used.

$$Tw = Tw0 + (b1 \cdot TT1 - b2 \cdot TT2 - Tw0) \cdot \exp\left(-\frac{b3 \cdot Tw0 + b4 \cdot TT1}{Tw0}\right) \quad (7)$$

According to this embodiment, the interconnect delay is corrected by the output transition time using the total load capacitance and the output transition time using the effective capacitance. The interconnect delay can be thus calculated with higher accuracy.

Figure 17:
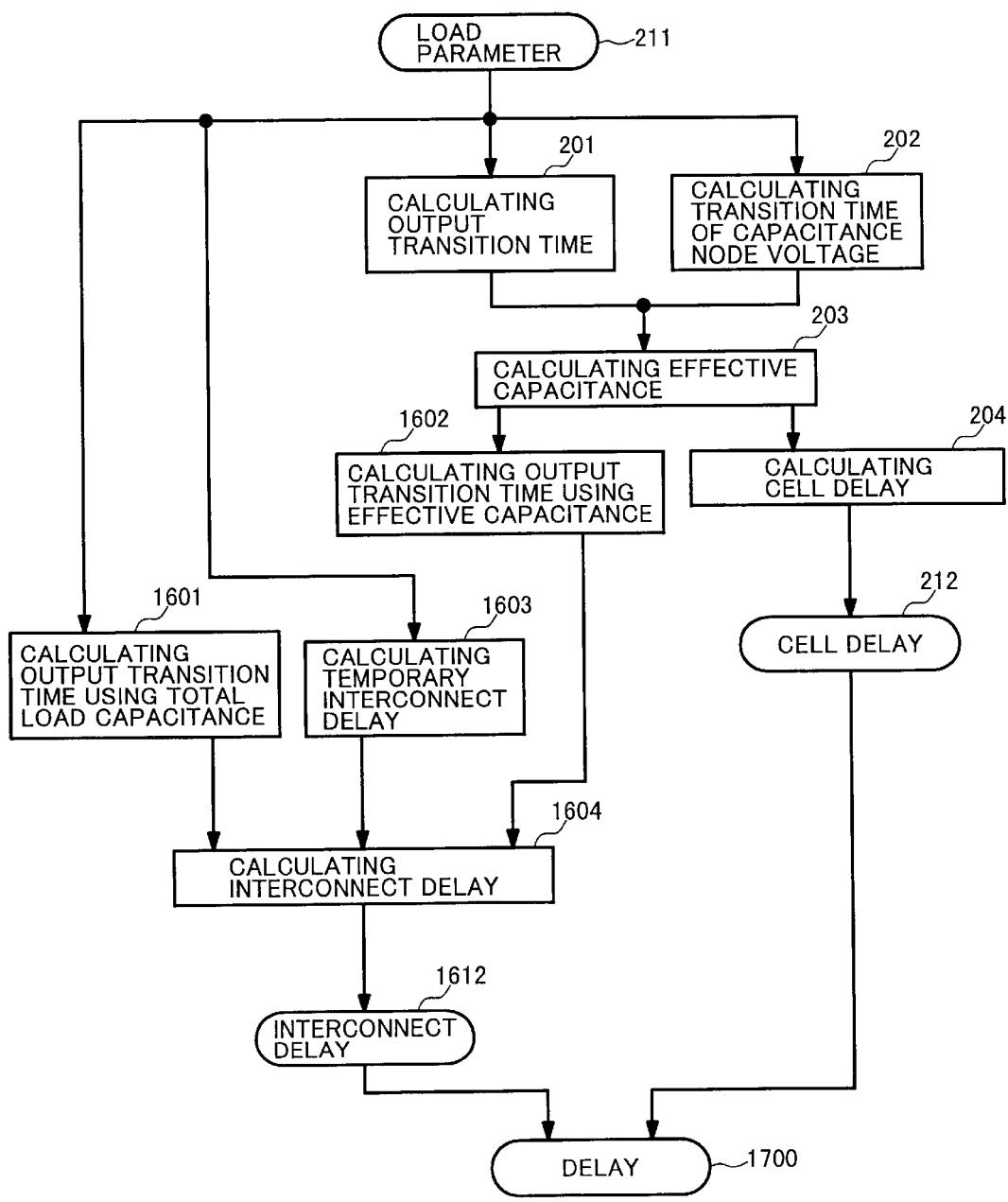
FIG. 17 is a diagram showing one embodiment of the delay calculation method of the present invention, and a procedure diagram when performing the cell delay calculation method in FIG. 2 and the interconnect delay calculation method in FIG. 16.

FIG. 17 shows a procedure for obtaining a delay of one gate stage of a semiconductor integrated circuit by the interconnect delay calculation method of this embodiment and the cell delay calculation method of FIG. 2. Here, the delay of one gate stage is a delay obtained by summing the cell delay of the target cell and the interconnect delay to the next gate stage.

In FIG. 17, similar reference numerals are used in FIGS. 2 and 16 to denote similar procedures, and the explanation thereof is omitted. The procedure of FIG. 17 is performed to obtain a delay of one gate stage 1700 with high accuracy from the interconnect delay 1612 and the cell delay 212.

The calculation procedure for obtaining a delay for one gate stage shown in FIG. 17 is applied to the delay calculation procedure 901 of FIG. 9. The high-accuracy delay considering the shield effect can be used for designing a semiconductor integrated circuit to design a high-performance semiconductor integrated circuit.

<Embodiment 10>

The design method of a semiconductor integrated circuit according to the present invention can be provided as a recording medium recording a program. In addition, a program can be provided by passing through a data transfer medium such as Internet. Further, it can be provided as a logic file optimization service using Internet.

Figure 14:
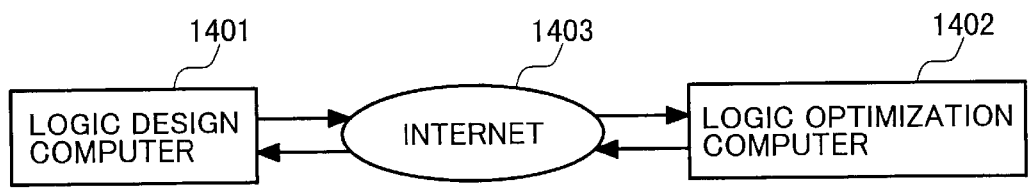
FIG. 14 is a diagram showing the construction example of a optimization service for a semiconductor integrated circuit as one embodiment of the design method of a semiconductor integrated circuit according to the present invention.

FIG. 14 shows the construction example of the logic file optimization service. In the drawing, the reference numeral 1401 denotes a logic design computer for receiving the optimization service, the reference numeral 1402 denotes a logic optimization computer for providing the optimization service, and the reference numeral 1403 denotes Internet connecting these computers. The logic design computer 1401 designs a logic file meeting a desired logic function and transfers the logic file through the Internet 1403 to the logic optimization computer. The logic optimization computer 1402 executes optimization for the received logic file to meet desired conditions using the method for designing a semiconductor integrated circuit according to the present invention, and sends back the resulting logic file through the Internet 1403 to the logic design computer 1401.

In this way, the logic design computer 1401 for receiving the optimization service may execute only logic design meeting the desired logic function. It is possible to reduce the enormous number of procedures meeting the limitation to a delay which is most difficult to design a high-performance semiconductor integrated circuit. In addition, the logic design computer 1401 for receiving the optimization service can easily use the above-mentioned design method of a high-performance semiconductor integrated circuit according to the present invention.

According to the present invention, a general load form can be used to calculate an effective capacitance, and high-accuracy delay calculation considering the shield effect in which a load capacitance appears to be small due to the influence of interconnect resistance is used to design a high-performance semiconductor integrated circuit.

In addition, according to the present invention, high-accuracy delay calculation can be processed fast, and a high-performance semiconductor integrated circuit can be designed for a short period of time.

What is claimed is:

1. A delay calculation method of a semiconductor integrated circuit having a plurality of electronic circuit cells and a plurality of wires, in which a circuit connected to the output pin of an electronic circuit cell is replaced by one effective capacitance to calculate a delay in said electronic circuit cell, comprising:

a procedure which inputs a load parameter in which a circuit connected to said output pin is expressed by an equivalent circuit including resistance and capacitance or inductance;

a procedure which calculates transition time until the voltage of said output pin reaches a definition voltage for delay;

a procedure which calculates voltage of capacitance node of said equivalent circuit at said transition time;

a procedure which calculates said effective capacitance from the voltage of said capacitance node; and a procedure which calculates a delay in said electronic circuit cell from said effective capacitance.

2. The delay calculation method according to claim 1, wherein in said effective capacitance calculation procedure, when said definition voltage for delay is Vd, said voltage of capacitance node i is Vci, and the capacitance value of said capacitance node i is Ci, said effective capacitance for said capacitances is calculated by summing the resulting values of Ci·Vci/Vd for all capacitance nodes i.

3. A delay calculation method of a semiconductor integrated circuit having a plurality of electronic circuit cells and a plurality of wires, in which a circuit connected to the output pin of an electronic circuit cell is replaced by one effective capacitance to calculate a delay in said electronic circuit cell, comprising:

a procedure which inputs a load parameter in which a circuit connected to said output pin is expressed by an equivalent circuit including resistances and capacitances or inductances;

a procedure which calculates output transition time until the voltage of said output pin reaches a definition voltage for delay;

a procedure which calculates capacitance node transition time until voltage of capacitance node of said equivalent circuit reaches said definition voltage for delay;

a procedure which calculates said effective capacitance from said output transition time and said capacitance node transition time; and a procedure which calculates a delay in said electronic circuit cell from said effective capacitance.

4. The delay calculation method according to claim 3, wherein in said effective capacitance calculation method, when said output transition time is To, said capacitance node transition time of capacitance node i is Ti, and the capacitance value of said capacitance node i is Ci, said effective capacitance for said capacitances is calculated by summing the resulting values of Ci·To/Ti for all capacitance nodes i.

5. The delay calculation method according to claim 4, wherein in said output transition time calculation method, the driver output resistance of said electronic circuit cell is Ron, and the sum of the capacitance values of all capacitances connected to said output pin is Ct, Ron·Ct is said output transition time.

6. The delay calculation method according to claim 5, wherein said effective capacitance calculated once is Ceff0, Ron·Ceff0 is said output transition time to re-calculate said effective capacitance.

7. The delay calculation method according to claim 4, wherein when said output transition time is To, and the delay from said output pin to said capacitance node is Tdi, said capacitance node transition time Ti is To+Tdi.

8. The delay calculation method according to claim 1, wherein when said effective capacitance is Ceff, and the input transition time of said electronic circuit cell is TI, delay parameters a, b, c and d are used to calculate a cell delay from the expression a·Ceff·TI+b·Ceff+c·TI+d.

9. The delay calculation method according to claim 3, wherein when said effective capacitance is Ceff, and the input transition time of said electronic circuit cell is TI, delay parameters a, b, c and d are used to calculate a cell delay from the expression a·Ceff·TI+b·Ceff+c·TI+d.

10. A design method of a semiconductor integrated circuit having a plurality of electronic circuit cells, comprising:

a delay calculation procedure which calculates a delay in said electronic circuit cell, a judgment procedure which judges whether desired conditions are met, and a cell modification procedure which modifies the type or a combination of said electronic circuits, in which the type or a combination of said electronic circuit cells is selected so as to meet the desired conditions, the design method comprising using the delay calculation method according to claim 1 as said delay calculation procedure.

11. A design method of a semiconductor integrated circuit having a plurality of electronic circuit cells, comprising:

a delay calculation procedure which calculates a delay in said electronic circuit cell, a judgment procedure which judges whether desired conditions are met, and a cell modification procedure which modifies the type or a combination of said electronic circuits, in which the type or a combination of said electronic circuit cells is selected so as to meet the desired conditions, the design method comprising using the delay calculation method according to claim 3 as said delay calculation procedure.

12. A recording medium which records a program for processing the delay calculation method according to claim 1.

13. A recording medium which records a program for processing the delay calculation method according to claim 3.

* * * * *